(12) United States Patent
Lesea

(10) Patent No.: US 6,874,107 B2
(45) Date of Patent: Mar. 29, 2005

(54) INTEGRATED TESTING OF SERIALIZER/ DESERIALIZER IN FPGA

(75) Inventor: Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 501 days.

(21) Appl. No.: 09/912,683

(22) Filed: Jul. 24, 2001

(65) Prior Publication Data

US 2003/0023912 A1 Jan. 30, 2003

(51) Int. Cl.[7] .................... G01R 31/3185; H01L 25/00; H01K 19/177; G06F 17/50; H03M 9/00
(52) U.S. Cl. ..................... 714/725; 326/41; 716/4; 716/16; 341/100; 341/101
(58) Field of Search ................. 714/731, 738, 714/742, 724–726; 326/41; 716/4, 16; 341/100–101

(56) References Cited

U.S. PATENT DOCUMENTS

| | | | |
|---|---|---|---|
| RE34,363 E | | 8/1993 | Freeman et al. |
| 5,361,373 A | * | 11/1994 | Gilson ........................... 712/1 |
| 5,671,355 A | * | 9/1997 | Collins ........................ 709/250 |
| 5,737,235 A | * | 4/1998 | Kean et al. .................... 716/16 |
| 5,790,563 A | | 8/1998 | Ramamurthy et al. |
| 5,793,822 A | | 8/1998 | Anderson et al. |
| 5,825,201 A | * | 10/1998 | Kolze ........................... 326/39 |
| 5,844,829 A | | 12/1998 | Freidin et al. |
| 5,914,616 A | | 6/1999 | Young et al. |
| 6,003,150 A | | 12/1999 | Stroud et al. |
| 6,020,755 A | * | 2/2000 | Andrews et al. ............... 326/39 |
| 6,096,091 A | * | 8/2000 | Hartmann ...................... 716/17 |
| 6,167,077 A | * | 12/2000 | Ducaroir et al. ............. 375/219 |
| 6,189,115 B1 | * | 2/2001 | Whetsel ......................... 714/28 |
| 6,191,614 B1 | * | 2/2001 | Schultz et al. ................. 326/41 |
| 6,232,845 B1 | | 5/2001 | Kingsley et al. |
| 6,295,315 B1 | * | 9/2001 | Frisch et al. ................. 375/226 |

OTHER PUBLICATIONS

"Digital Systems Testing and Testable Design" Abramovici et al. (c) 1990 IEEE Press.*

* cited by examiner

Primary Examiner—Albert Decady
Assistant Examiner—Cynthia Britt
(74) Attorney, Agent, or Firm—Russell D. Slifer; Bernard S. Hoffman; Justin Liu

(57) ABSTRACT

A field programmable gate array (FPGA) device includes a high-speed serializer/deserializer (SERDES). The field programmable gate array allows programmable built-in testing of the SERDES at operating speeds. A digital clock manager circuit allows clock signals coupled to the SERDES to be modified during the test operations to stress the SERDES circuit. The logic array of the FPGA can be programmed to generate test patterns and to analyze data received by the SERDES circuit. Cyclic redundancy check (CRC) characters, or other error checking characters, can also be generated using the logic array. During testing, the FPGA can perform extensive tests on the communication circuitry and store the results of the testing. An external tester can read the results of the test without substantial test time or complicated test equipment. After testing is complete, the device may be re-programmed to perform the end-user function, adding zero cost to the device for test implementation.

16 Claims, 4 Drawing Sheets

INTEGRATED TESTING OF SERIALIZER/DESERIALIZER IN FPGA

FIELD OF THE INVENTION

The present invention relates generally to field programmable gate arrays (FPGAs) and in particular the present invention relates to integrated testing of FPGAs.

BACKGROUND OF THE INVENTION

The development of optical fiber transmission of digital data streams has given rise to a data transfer protocol and interface system termed Fiber-Channel. Fiber-Channel technology involves coupling various computer systems together with optical fiber or a fiber-channel-compatible electrically conductive (copper) cable and allows extremely rapid data transmission speeds between machines separated by relatively great distances. A Fiber Channel family of standards (developed by the American National Standards Institute (ANSI)) defines a high speed communications interface for the transfer of large amounts of data between a variety of hardware systems such as personal computers, workstations, mainframes, supercomputers, storage devices and servers that have Fiber Channel interfaces. Use of Fiber Channel is proliferating in client/server applications that demand high bandwidth and low latency I/O. Fiber Channel achieves high performance, which is critical in opening the bandwidth limitations of current computer-to-storage and computer-to-computer interfaces at speeds up to 1 gigabit per second or faster.

Information to be transmitted over a fiber wire or cable is encoded, 8 bits at a time, into a 10-bit Transmission Character that is subsequently serially transmitted bit by bit. Data provided over a typical computer system's parallel architecture is encoded and framed such that each data byte (8-bits from the point of view of the computer system) is formed into a Transmission Character in accordance with the Fiber-Channel 8B/10B transmission code. The resulting 8B/10B character is then transmitted as 10 sequential bits at a 1.06 GHz data rate. Likewise, an incoming 8B/10B encoded transmission character must be serially received at a 1.06 GHz data rate and converted (framed) into the corresponding 10-bit transmission character. The 10-bit transmission character is then further decoded into an 8-bit byte recognizable by conventional computer architectures.

In data processing systems and data networks information is transferred over serial and parallel buses between systems, and an interface exists to provide compatibility between the data processing system and the bus to which it connects. Moreover some networks provide an interface between diverse buses with different characteristics. As an example, an interface may couple a data processing system PCI bus to a fiber channel. The PCI bus operates with parallel data paths whereas a fiber channel operates with serial data paths.

A serializer/deserializer (SERDES) forms an integral part of a fiber channel interface circuit between the serialized data paths of the fiber channel and the parallel data paths of an integrated circuit interface. A fiber channel interface connects to the SERDES through a connection and to a frame processing circuit through parallel data buses that essentially transfer information to and from the frame processing circuit.

As integrated circuits continue to increase in complexity, it is increasingly difficult to test the device. In particular, in order to test an integrated circuit, a large number of test patterns and configurations may be required. The response to the test patterns is then monitored to determine if defects are present. This testing is time-consuming and may use all of the input/output pins of the integrated circuit. Accordingly, it is known to provide a circuit(s) in the integrated circuit device itself to provide a Built-In Self Test (BIST).

Programmable logic devices (PLDs) are a well-known type of digital integrated circuit that may be programmed by a user (e.g., a circuit designer) to perform specified logic functions. One type of PLD, the field-programmable gate array (FPGA), typically includes an array of configurable logic blocks, or CLBS, that are programmably interconnected to each other and to programmable input/output blocks (IOBs). FPGAs can be provided that includes a high speed interconnect that require a SERDES.

For the reasons stated above, and for other reasons stated below which will become apparent to those skilled in the art upon reading and understanding the present specification, there is a need in the art for a method of testing high speed SERDES circuitry in an FPGA.

SUMMARY OF THE INVENTION

The above-mentioned problems with testing high speed SERDES circuitry in an FPGA and other problems are addressed by the present invention and will be understood by reading and studying the following specification.

In one embodiment, a field programmable gate array (FPGA) comprises a logic array, a data communication connection, and a serializer/deserializer circuit coupled to the data communication connection and the logic array. The logic array is programmable to perform test operations on the serializer/deserializer circuit. After testing is completed, the programmable circuitry may be re-programmed to perform the end user application, thereby creating zero added cost for providing the test feature in the silicon.

In another embodiment, a field programmable gate array (FPGA) comprises input and output data communication connections, a serializer/deserializer circuit coupled to the input and output data communication connections, and a logic array programmed to generate a test data pattern coupled to the output data connection. The logic array is further programmed to check a data pattern received on the input connection while performing a built in self test operation. After test, the circuit may be re-programmed as stated above.

A method of testing a high speed interconnect circuit of a field programmable gate array (FPGA) comprises generating a test pattern using programmed logic circuitry of the FPGA, outputting the test pattern on an output connection, coupling the test pattern to an input connection of the high speed interconnect circuit, evaluating data received on the input connection using the programmed logic circuitry, and storing data indicating a result of the evaluation. After test, the circuit may be re-programmed as stated above.

Still another method of testing a serializer/deserializer (SERDES) circuit of a field programmable gate array (FPGA) comprises programming a logic array of the FPGA, and generating a test pattern using the programmed logic circuitry of the FPGA. The test pattern is output on an output connection of the SERDES, and the output connection is externally coupled to an input connection of the SERDES. Using the programmed logic array, the data received on the input connection is evaluated, and data indicating a result of the evaluation is stored in a memory circuit of the FPGA. After test, the circuit may be re-programmed as stated above.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
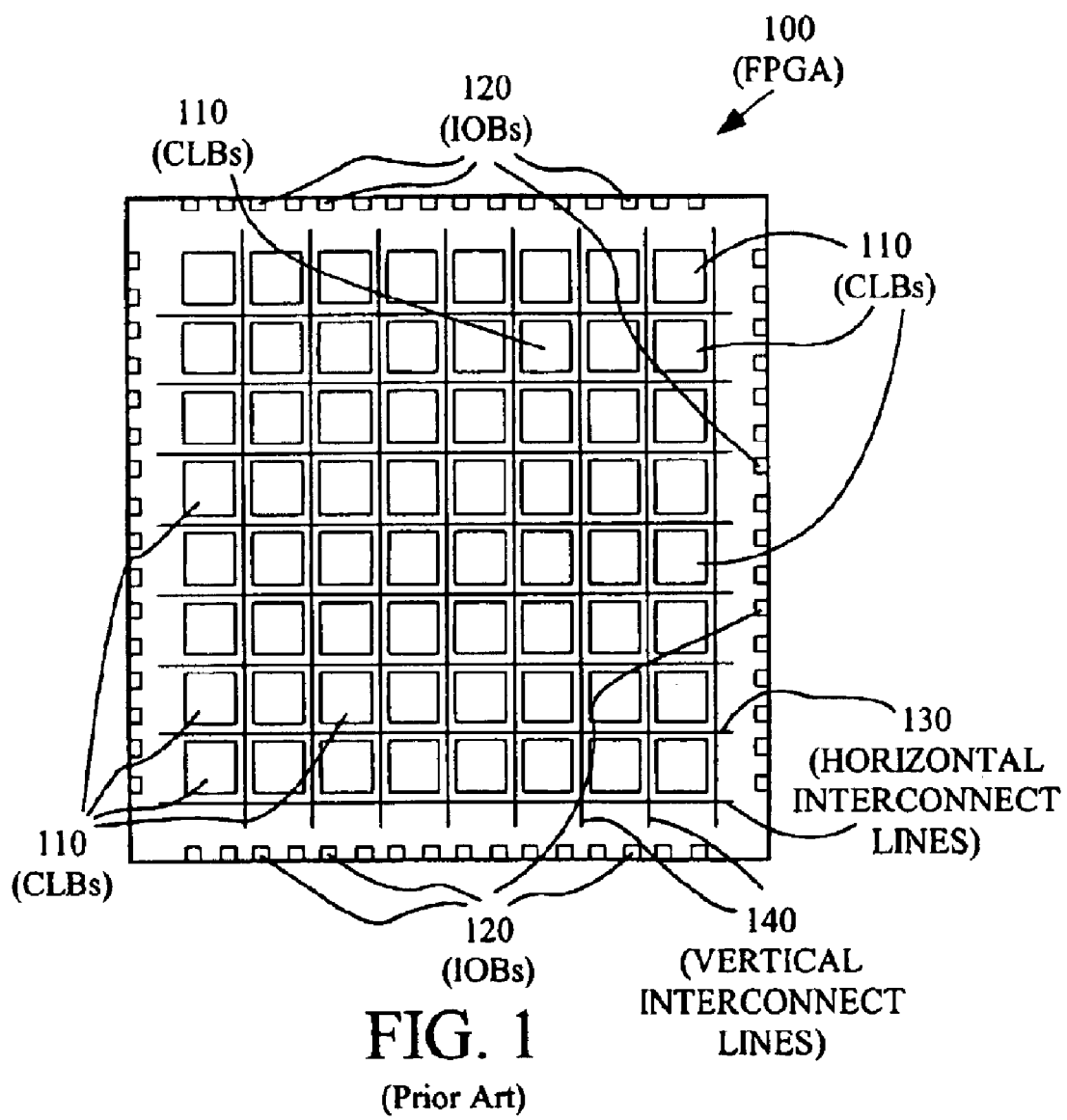
FIG. 1 illustrates a logic array of a prior art field programmable gate array (FPGA)

FIG. 1 is a simplified block diagram of a prior art field-programmable gate array (FPGA) 100. FPGA 100 includes an array of configurable logic blocks (CLBs) 110 that are programmably interconnected to each other and to programmable input/output blocks (IOB's) 120. The interconnections are provided by a complex interconnect matrix represented as horizontal and vertical interconnect lines 130 and 140. Detailed descriptions of FPGA architectures may be found in U.S. Pat. Nos. 34,363 and 5,914,616, incorporated herein by reference.

This collection of configurable elements and interconnect may be customized by loading configuration data into internal configuration memory cells (not shown) that define how the CLBs, interconnect lines, and IOBs are configured. A detailed description of an FPGA configuration structure may be found in U.S. Pat. No. 5,844,829, incorporated herein by reference. The configuration data may be read from memory or written into FPGA 100 from an external device. The collective program states of the individual memory cells then determine the function of FPGA 100. A value of FPGA 100 is that its logical function can be changed at will by loading new or partially new or different configurations (re-programming). Such changes are accomplished by loading the configuration memory cells and resetting (or presetting) the user logic, or through the configurable logic itself (self reconfiguration).

CLBs 110 and IOBs 120 additionally include user-accessible memory elements (not shown), the contents of which can be modified as FPGA 100 operates as a logic circuit. These user-accessible memory elements, or "user logic," include block RAM, latches, and flip-flops. The data stored in user logic is alternatively referred to as "user data" or "state data."

The present invention provides an FPGA that has a bi-directional interface for high-speed communication, such as gigabit communications. A serializer/deserializer (SERDES) is provided to interface with the external high-speed bus. During fabrication, it is desired to test the SERDES circuit for both functional integrity and proper operation at communications speeds such as 3+ gigabits per second. As explained below, embodiments of the present invention allow testing of the SERDES circuit at communication speeds and while stressed.

One embodiment of the present FPGA includes sixteen SERDES circuits that are each capable of communicating at gigabit speeds. The SERDES circuits are coupleable to internal digital clock manager (DCM) circuits. The DCMs generate both a transmit clock and a receive clock for the SERDES circuits. The DCMs are capable of adding noise or jitter to the clock signals. In addition, the DCMs can create frequency offsets and shift phase by predetermined amounts. As such, the FPGA can add stress to the SERDES circuit by manipulating the clock signal characteristics.

The FPGA logic components can be programmed during testing to operate as test circuitry to perform operation tests of the SERDES circuits. This built-in-self-test (BIST) feature provides an advantage not available in conventional integrated circuits. Test circuitry required to implement a BIST for testing high-speed SERDES circuits would be too extensive and cost prohibitive to fabricate as part of an integrated circuit.

To test the SERDES circuitry, the FPGA logic is programmed to provide a pseudo random bitstream generator, stress pattern generators, cyclical redundancy check (CRC) circuitry and bit error rate testers. As explained below, the pseudo random bitstream generator can be implemented using a linear feedback shift register (LFSR).

Figure 2:
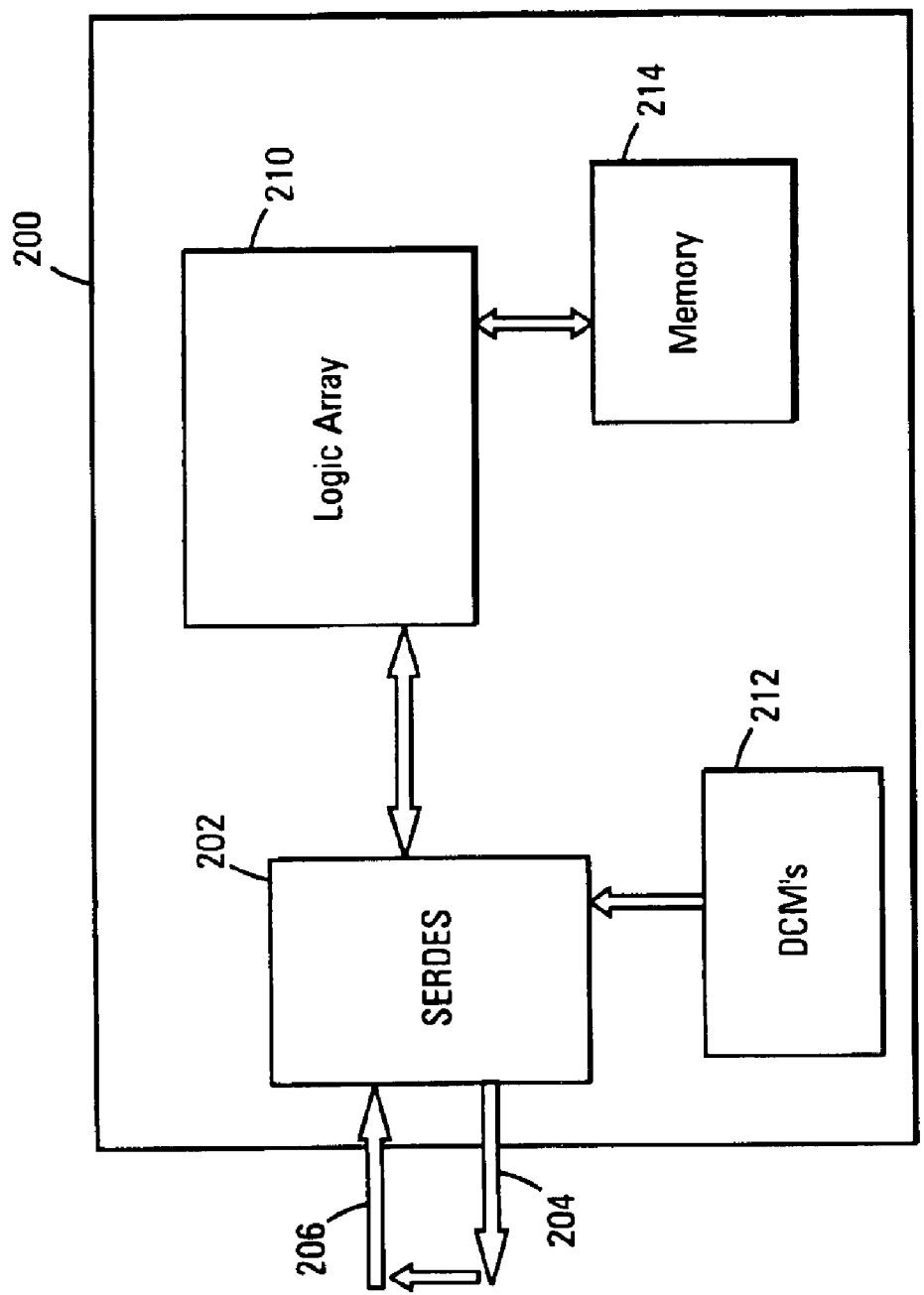
FIG. 2 is a block diagram of an embodiment of an FPGA of the present invention.

Referring to FIG. 2, a block diagram of an FPGA 200 the present invention is described. The device includes a SERDES circuit 202 coupled with external transmit 204 and receive 206 connections. The SERDES circuit is coupled to the internal logic circuit of the FPGA. Digital clock manager circuits 212 are coupled to the logic circuits to provide transmit and receive clock signals. By coupling the outputs of the SERDES circuit to its inputs, the logic applies test patterns to the communication circuitry. For stress, jitter can be added to the clock signals while the test is performed. The results of the test are then stored in the FPGA internal memory 214. The test results can be subsequently read to determine if the device encountered performance problems.

Figure 3:
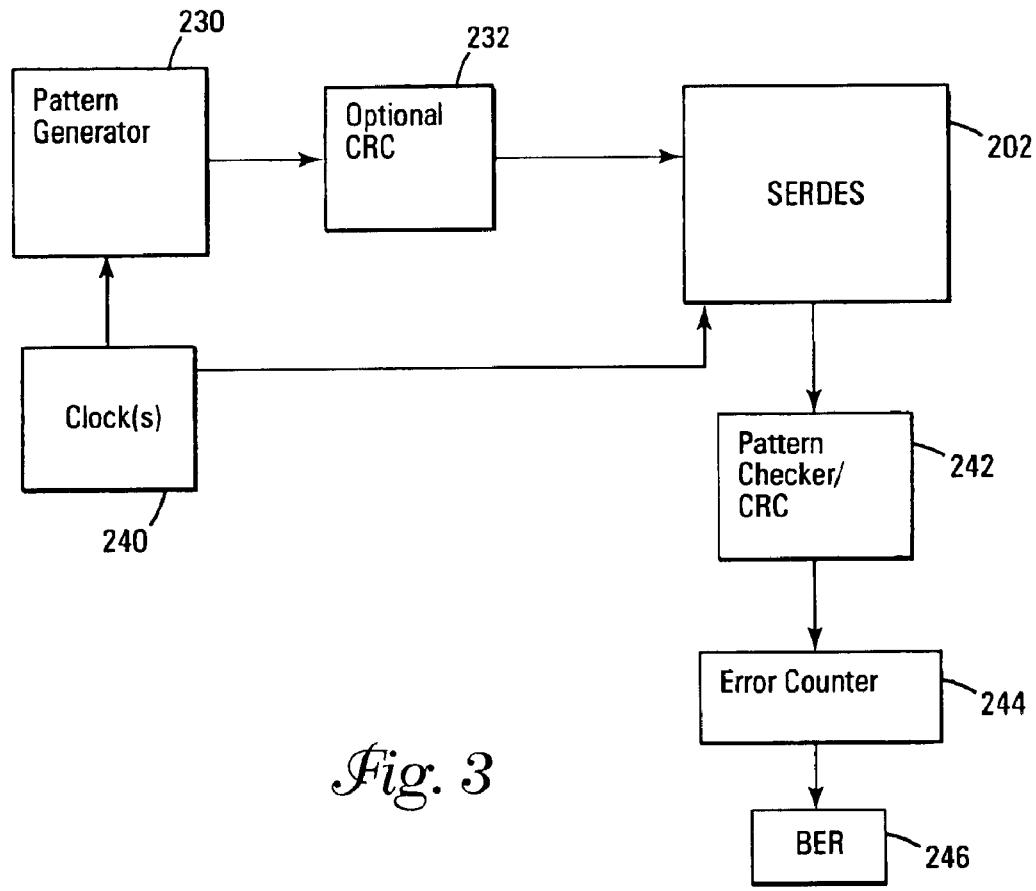
FIG. 3 is a block diagram of an FPGA test circuit of an embodiment of the present invention.

FIG. 3 illustrates a block diagram of a bit error rate tester of the present invention. The tester includes a pattern generator 230 programmed into the FPGA array. The pattern generator can be implemented as a linear feedback shift register. An optional cyclical redundancy check (CRC) circuit 232 can be programmed in the FPGA to provide CRC characters to the test program. Other error checking characters can be used, including simple parity checks. As such, the present invention is not limited to CRC characters. The test data pattern is coupled to the SERDES channel 202 under test. The clock(s) 240 used to control the test pattern can be stressed, as indicated above, to enhance the testing operation. The data received by the SERDES is then checked for possible errors using check circuitry 242 programmed in the FPGA array. If CRC 232 is provided, the received CRC characters are also checked. An error counter 244 is programmed in the FPGA logic to maintain a total count of errors encountered during testing. The number of errors from the counter is analyzed by bit error rate (BER) circuit 246 to determine the number of errors encountered per the number of bits tested to provide a BER. The BER can be stored in memory for retrieval or a pass-fail code can be stored based upon a threshold BER. That is, a tester can read the FPGA memory to determine if the part passed the test, or it can analyze a stored BER to determine if the device meets acceptable criteria.

Figure 4:
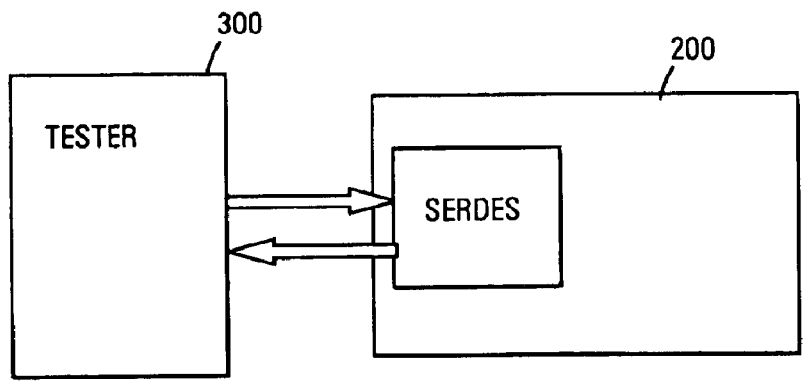
FIG. 4 illustrates an FPGA coupled to a tester circuit.

A test system is illustrated in FIG. 4 that includes a test circuit 300 and an FPGA 200. The FPGA has been programmed as described above to provide a built in self-test (BIST) of data communication circuitry provided in the FPGA. The test circuitry can be a microprocessor device or a test specific device such as the ring oscillator described in U.S. Pat. No. 6,232,845, incorporated herein by reference. If a microprocessor is used, it may also be implemented as a dedicated core of logic within the FPGA, or as a set of programmed logic blocks performing the same microprocessor function in the CLBs. During a test operation, the FPGA generates a test pattern that is output on the output communication connection. The output connection is coupled to the FPGA input connection and the received data pattern is evaluated. If errors are detected, data indicating a status of the FPGA error rate is programmed into a memory of the FPGA. The test circuit can access, or read, the contents of the FPGA memory to determine if the FPGA is good, or has an acceptable error rate level. The FPGA of the present invention has an advantage over fabricating test specific circuitry in an integrated circuit to perform a BIST of a high-speed communication circuit. Specifically, the FPGA of the present invention includes a digital clock manager circuit that can generate clock signals to stress the test operation by varying the frequency, phase and jitter magnitude and jitter frequencies of the clock signals. Implementing test specific circuitry in an integrated circuit to perform these tests would be space and cost prohibitive. The programmable logic can be re-used for the end application by re-programming, resulting in zero cost for the test feature.

Figure 5:
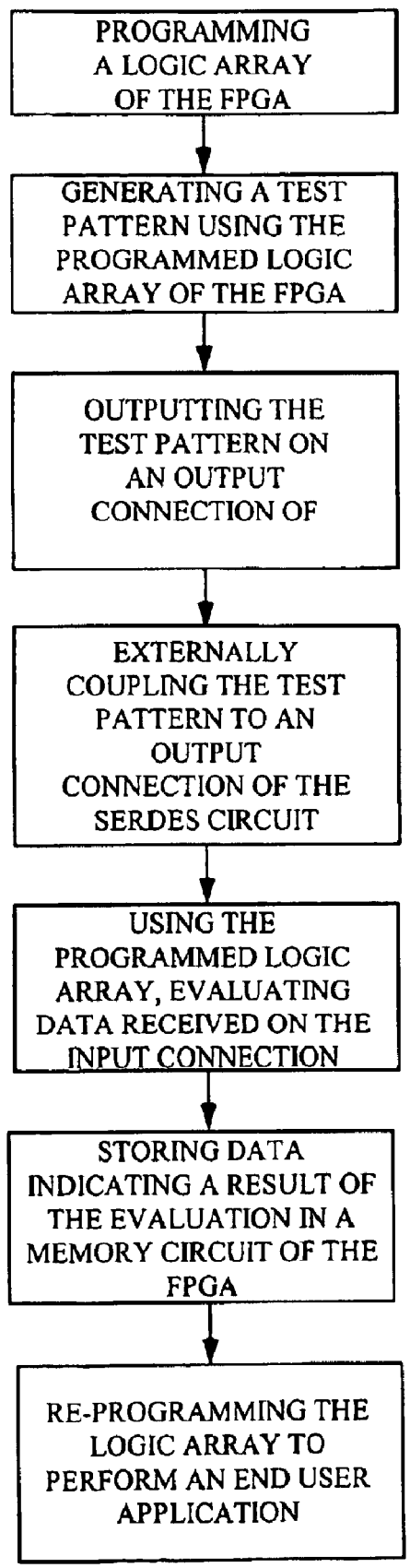
FIG. 5 is a flow chart of the method of testing a serializer/deserializer (SERDES) circuit of a field programmable gate array (FPGA).

FIG. 5 is a flow chart of the method of testing a serializer/deserializer (SERDES) circuit of a field programmable gate array (FPGA).

CONCLUSION

A field programmable gate array (FPGA) device has been described that includes a high-speed serializer/deserializer (SERDES). The field programmable gate array allows built in testing of the SERDES at operating speeds. A digital clock manager circuit allows clock signals coupled to the SERDES to be modified during the test operations to stress the SERDES circuit. The logic array of the FPGA can be programmed to generate a test pattern and to analyze data received by the SERDES circuit. Cyclic redundancy check (CRC) characters can also be generated using the logic array. During testing, the FPGA can perform extensive tests on the communication circuitry and store the results of the testing. An external tester can read the results of the test without substantial test time or complicated test equipment.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A field programmable gate array (FPGA) comprising:
input and output data communication connections;
a serializer/deserializer circuit coupled to the input and output data communication connections; and
a logic array programmed to generate a test data pattern coupled to the output data communication connection, the logic array is further programmed to check a data pattern received on the input data communication connection while performing a built in self test operation.

2. The FPGA of claim 1 further comprises a digital clock manager circuit to generate a clock signal couplable to the logic array, wherein the digital clock manager circuit adds noise and jitter in a controlled manner in both programmable jitter amplitude and programmable jitter frequency to the clock signal during the built in self test operation.

3. The FPGA of claim 1 further comprises a digital clock manager circuit to generate clock signals couplable to the logic array, wherein the digital clock manager circuit creates frequency offsets and phase shift phases between the clock signals during test operations.

4. The FPGA of claim 1 wherein the logic array is further programmed to insert cyclical redundancy check characters in the test data pattern.

5. The FPGA of claim 1 further comprising a memory to store data indicating test operation results.

6. A method of testing a high speed interconnect circuit of a field programmable gate array (FPGA) comprising:
generating a test pattern using programmed logic circuitry of the FPGA;
outputting the test pattern on an output connection;
coupling the test pattern to an input connection of the high speed interconnect circuit;
evaluating data received on the input connection using the programmed logic circuitry; and
storing data indicating a result of the evaluation.

7. The method of claim 6 wherein the logic array is programmed to operate as a linear feedback shift register to provide a pseudo random bit stream as the test pattern.

8. The method of claim 6 further comprises adding an error checking character to the test pattern prior to outputting the test pattern on the output connection.

9. The method of claim 8 wherein evaluating the data received included evaluating the error checking character.

10. A test system comprising:
a test circuit; and
a field programmable gate array (FPGA) coupled to the test circuit, wherein the FPGA comprises,
input and output data communication connections coupled together through the test circuit,
a serializer/deserializer (SERDES) circuit coupled to the input and output data communication connections, and
a logic array programmed to generate a test data pattern coupled to the output data communication connection, the logic array is further programmed to check a data pattern received on the input connection while performing a built in self test operation.

11. The test system of claim 10 wherein the FPGA comprises a memory to store data indicative of a result of the check of the received data pattern.

12. The test system of claim 11 wherein the test circuit accesses the FPGA memory to determine an error status of the FPGA.

13. A method of testing a serializer/deserializer (SERDES) circuit of a field programmable gate array (FPGA) comprising:
programming a logic array of the FPGA;
generating a test pattern using the programmed logic array of the FPGA;
outputting the test pattern on an output connection of the SERDES circuit;
externally coupling the test pattern to an input connection of the SERDES circuit;
using the programmed logic array, evaluating data received on the input connection;
storing data indicating a result of the evaluation in a memory circuit of the FPGA; and re-programming the logic array to perform an end user application.

14. The method of claim 13 wherein the logic array is programmed to comprise a pseudo random bit generator function, or other stress or test pattern.

15. The method of claim 13 further comprises:
generating a clock signal using a digital clock manager (DCM) circuit; and
coupling the clock signal to the SERDES circuit.

16. The method of claim 13 further comprises:
generating transmit and receive clock signals using a digital clock manager (DCM) circuit, wherein the digital clock manager circuit creates frequency offsets, jitter magnitude and jitter frequency and phase shift phases between the transmit and receive clock signals; and coupling the clock signal to the SERDES circuit.

* * * * *